US012609707B2

(12) United States Patent
Lu et al.

(10) Patent No.: US 12,609,707 B2
(45) Date of Patent: Apr. 21, 2026

(54) PHASE-LOCKED LOOPS (PLL) INCLUDING DIGITALLY CONTROLLED OSCILLATOR (DCO) GAIN CALIBRATION CIRCUITS AND RELATED METHODS

(71) Applicant: Microsoft Technology Licensing, LLC, Redmond, WA (US)

(72) Inventors: Ping Lu, Cary, NC (US); Bupesh Pandita, Cary, NC (US); Minhan Chen, Cary, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 405 days.

(21) Appl. No.: 18/104,916

(22) Filed: Feb. 2, 2023

(65) Prior Publication Data

US 2024/0267052 A1 Aug. 8, 2024

(51) Int. Cl.
*H03L 7/093* (2006.01)
*H03L 7/099* (2006.01)

(52) U.S. Cl.
CPC ............ *H03L 7/093* (2013.01); *H03L 7/0995* (2013.01)

(58) Field of Classification Search
CPC ........ H03L 7/093; H03L 7/099; H03L 7/0995
See application file for complete search history.

(56) References Cited

U.S. PATENT DOCUMENTS 6,026,501 A 2/2000 Hohl et al.
10,680,622 B2 6/2020 Monk
11,646,743 B1 5/2023 Sabharwal
2011/0133799 A1 * 6/2011 Dunworth ............... H03L 7/093 327/156
2019/0052278 A1 2/2019 Pandita
(Continued)

FOREIGN PATENT DOCUMENTS

GB 2380831 A 4/2003
GB 2487575 A 8/2012

OTHER PUBLICATIONS

Notice of Allowance mailed on Apr. 8, 2024, in U.S. Appl. No. 18/114,847, 9 pages.

(Continued)

*Primary Examiner* — Patrick O Neill
(74) *Attorney, Agent, or Firm* — Novo TechIP International PLLC

(57) ABSTRACT

Interfaces between clock domains of an integrated circuit (IC) depend on synchronization of phase-locked loops (PLLs) that generate clocks in the different domains and on how each PLL responds to jitter in a shared reference clock. The well-controlled same bandwidth (and loop dynamic) for those PLLs renders the same and, therefore, ignorable reference jitter contribution. As a key component that determines a digital PLL bandwidth, digitally controlled oscillator (DCO) may have its gain vary with process, temperature, and supply IR drop from chip to chip or even module to module. A calibration circuit provides a gain correction factor to achieve a nominal gain in DCO as well as a desired/target PLL loop bandwidth. In some examples, the calibration circuit in each PLL determines a gain correction factor that causes the PLLs to have a common jitter response and stores the gain correction factors in the calibration circuits.

22 Claims, 7 Drawing Sheets

(56) References Cited

U.S. PATENT DOCUMENTS

| | | | |
|---|---|---|---|
| 2023/0384738 | A1 | 11/2023 | Lu |
| 2024/0291495 | A1 | 8/2024 | Lu |

OTHER PUBLICATIONS

Notice of Allowance mailed on Sep. 18, 2024, in U.S. Appl. No. 18/114,847, 9 pages.
Ebuchi, et al., "A 125-1250 MHz process-independent adaptive bandwidth spread spectrum clock generator with digital controlled self-calibration," IEEE Journal of Solid-State Circuits, vol. 44, Issue No. 3, Mar. 1, 2009, pp. 763-774.
Kim, et al., "Self-calibrated digital two-point modulator for BLE RF transmitter," IEEE Transactions on Circuits and Systems II: Express Briefs, vol. 69, Issue No. 12, Jun. 20, 2022, pp. 4739-4743.
Marzin, et al., "A 20 Mb/s Phase Modulator Based on a 3.6 GHz Digital PLL With 36 dB EVM at 5 mW Power," IEEE Journal of Solid-State Circuits, vol. 47, Issue No. 12, Dec. 1, 2012, pp. 2974-2988.
International Search Report and Written Opinion received for PCT Application No. PCT/US2024/013530, Jun. 24, 2024, 14 pages.
International Search Report and Written Opinion received for PCT Application No. PCT/US2024/016420, Jul. 17, 2024, 13 pages.
International Preliminary Report on Patentability (Chapter 1) received for PCT Application No. PCT/US2024/016420, mailed on Sep. 11, 2025, 09 Pages.
International Preliminary Report on Patentability received for PCT Application No. PCT/US2024/013530, mailed on Aug. 14, 2025, 08 pages.

* cited by examiner

N(z)

LONG DASH 128: $K_{DCO} > K_{DCO\_NOM}$

SHORT DASH 126: $K_{DCO} < K_{DCO\_NOM}$

SOLID 124: $K_{DCO} = K_{DCO\_NOM}$

300

302
RECEIVE, IN A DELTA DETECTOR 208, A REFERENCE CLOCK CLK_REF AND A FEEDBACK SIGNAL FB

304
GENERATE A DELTA VALUE DV INDICTING A TIME DIFFERENCE BETWEEN THE REFERENCE SIGNAL CLK_REF AND THE FEEDBACK SIGNAL FB

306
RECEIVE, IN A DIVIDER CIRCUIT 210, AN OUTPUT CLOCK CLK_OUT

308
DIVIDE THE OUTPUT CLOCK CLK_OUT TO GENERATE THE FEEDBACK SIGNAL FB

310
RECEIVE, IN AN OUTPUT CLOCK GENERATOR 204, THE DELTA VALUE DV

312
GENERATE A CONTROL SIGNAL DCO_CTL BASED ON THE DELTA VALUE DV

314
GENERATE THE OUTPUT CLOCK CLK_OUT BASED ON THE CONROL SIGNAL DCO_CTL

316
STORE A GAIN CORRECTION FACTOR $K_{CF}$ IN A GAIN CONTROL CIRCUIT 206 IN A CALIBRATION CIRCUIT 222

318
PROVIDE THE GAIN CORRECTION FACTOR $K_{CF}$ TO THE OUTPUT CLOCK GENERATOR 204

320
ADJUST, IN THE OUTPUT CLOCK GENERATOR 204, A GAIN IN RESPONSE TO THE GAIN CORRECTION FACTOR $K_{CF}$

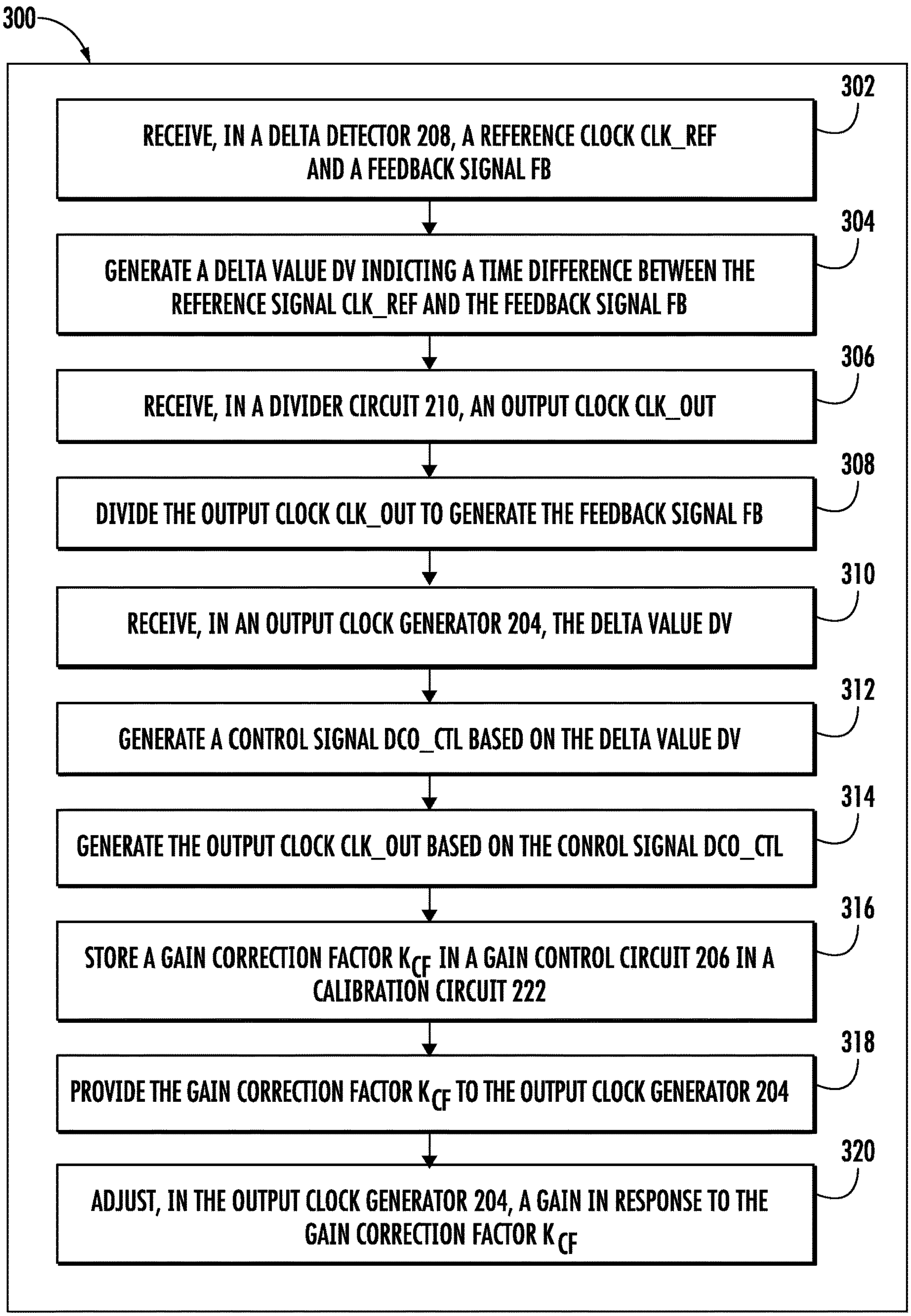

FIG. 3

PHASE-LOCKED LOOPS (PLL) INCLUDING DIGITALLY CONTROLLED OSCILLATOR (DCO) GAIN CALIBRATION CIRCUITS AND RELATED METHODS

FIELD OF THE DISCLOSURE

The technology of the disclosure relates, in general, to phase-locked loops (PLL) and, more particularly, to jitter response in PLLs.

BACKGROUND

Integrated circuits (ICs) can include multiple clock domains that communicate with each other, with each clock domain being a group of circuits that receive the same clock. Communications between circuits in different clock domains rely on synchronization of their respective clocks. Each clock domain may have a dedicated phase-locked loop (PLL) for providing a clock to the circuits within the clock domain. A PLL includes a voltage-controlled oscillator (VCO) or a digitally controlled oscillator (DCO) that oscillates at a frequency corresponding to a reference clock. When the output clock generated by the PLL is not synchronized with the reference clock, a time difference is detected and used to generate a control signal to adjust the frequency of the output clock. In a PLL that includes a DCO, the control signal is a digital value generated by comparing a feedback signal based on the output clock to the reference clock. There is a time difference between the feedback signal and the reference clock when a PLL is initially powered on, but the time difference is gradually reduced until the PLL is in a lock (i.e., synchronized) state. However, variations that occur in the reference clock, such as jitter, can disturb the PLL output clock edges. The manner in which a PLL responds to the reference jitter can vary depending on the loop bandwidth. If the PLLs in different clock domains of an IC receive the same reference clock but respond differently to jitter in the reference clock, the jitter can cause timing problems that reduce performance or cause communication failures.

SUMMARY

Exemplary aspects disclosed herein include phase-locked loops (PLLs) that include digitally controlled oscillator (DCO) gain calibration circuits. Related methods of DCO gain calibration are also disclosed. Synchronization of the clocks in different clock domains of an integrated circuit (IC) is important in a high-performance interface between those clock domains. PLLs can achieve synchronization among the clock domains by generating domain clocks based on the same reference clock. However, jitter in the reference clock signal can upset the synchronization if the PLLs do not respond to the jitter in the same way. In an exemplary PLL disclosed herein, a calibration circuit provides a gain correction factor to achieve a nominal gain in an output clock generator for a desired loop bandwidth. In this manner, the PLLs in different clock domains can be calibrated to have a similar jitter response. If the loop bandwidths of all the PLLs in an IC are calibrated to the desired loop bandwidth, they will have similar responses to jitter in the reference clock and maintain a neglectable relative timing uncertainty as well as a high-performance interface. A PLL feedback loop detects a time difference between a reference clock and a feedback signal that is based on an output clock. The PLL includes an output clock generator that adjusts the output clock to reduce the time difference. The gain of the output clock generator, which is determined in part by the DCO, is one of the factors determining how the output clock generator responds to reference clock jitter. The DCO gain, and thus the output clock generator gain, can vary from one PLL to another due to differences in manufacturing processes and circuit environment. The calibration circuit may be employed to determine and provide a gain correction factor that adjusts the gain of the output clock generator to a nominal gain corresponding to a desired loop bandwidth in the PLL.

In one exemplary aspect, a PLL comprising a delta detector configured to receive a reference clock and a feedback signal and generate a delta value indicating a time difference between the reference clock and the feedback signal, and a divider circuit configured to receive an output clock and generate the feedback signal based on the output clock is disclosed. The PLL comprises an output clock generator configured to receive the delta value, generate a control signal based on the delta value, and generate the output clock signal based on the control signal. The PLL also comprises a calibration circuit configured to provide a gain correction factor to the output clock generator, wherein the output clock generator is further configured to adjust a gain in response to the gain correction factor.

In another exemplary aspect, a method of generating an output clock in a phase-locked loop is disclosed. The method comprises receiving, in a delta detector, a reference clock and a feedback signal, generating, in the delta detector, a delta value indicating a time difference between the reference clock and the feedback signal, receiving, in a divider circuit, an output clock, and generating the feedback signal based on the output clock. The method further comprises receiving, in an output clock generator, the delta value, generating a control signal based on the delta value, and generating the output clock based on the control signal. The method also comprises providing, by a calibration circuit, a gain correction factor to the output clock generator; and adjusting a gain of the output clock generator in response to the gain correction factor.

In another exemplary aspect, an IC is disclosed. The IC comprises logic circuits disposed in a plurality of clock domains, each clock domain comprising a plurality of PLLs configured to generate clocks to be provided to the logic circuits in a corresponding clock domain. Each PLL in the IC comprises a delta detector configured to receive a reference clock and a feedback signal and generate a delta value indicating a time difference between the reference clock and the feedback signal and a divider circuit configured to receive an output clock and generate the feedback signal based on the output clock. The PLL comprises an output clock generator configured to receive the delta value, generate a control signal based on the delta value, and generate the output clock signal based on the control signal. The PLL also includes a calibration circuit configured to provide a gain correction factor to the output clock generator, wherein the output clock generator is further configured to adjust a gain in response to the gain correction factor.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIG. 3 is a flow chart of a method of generating an output clock in a PLL that includes providing a gain correction factor to adjust the output clock generator to a nominal gain;

Figure 4:
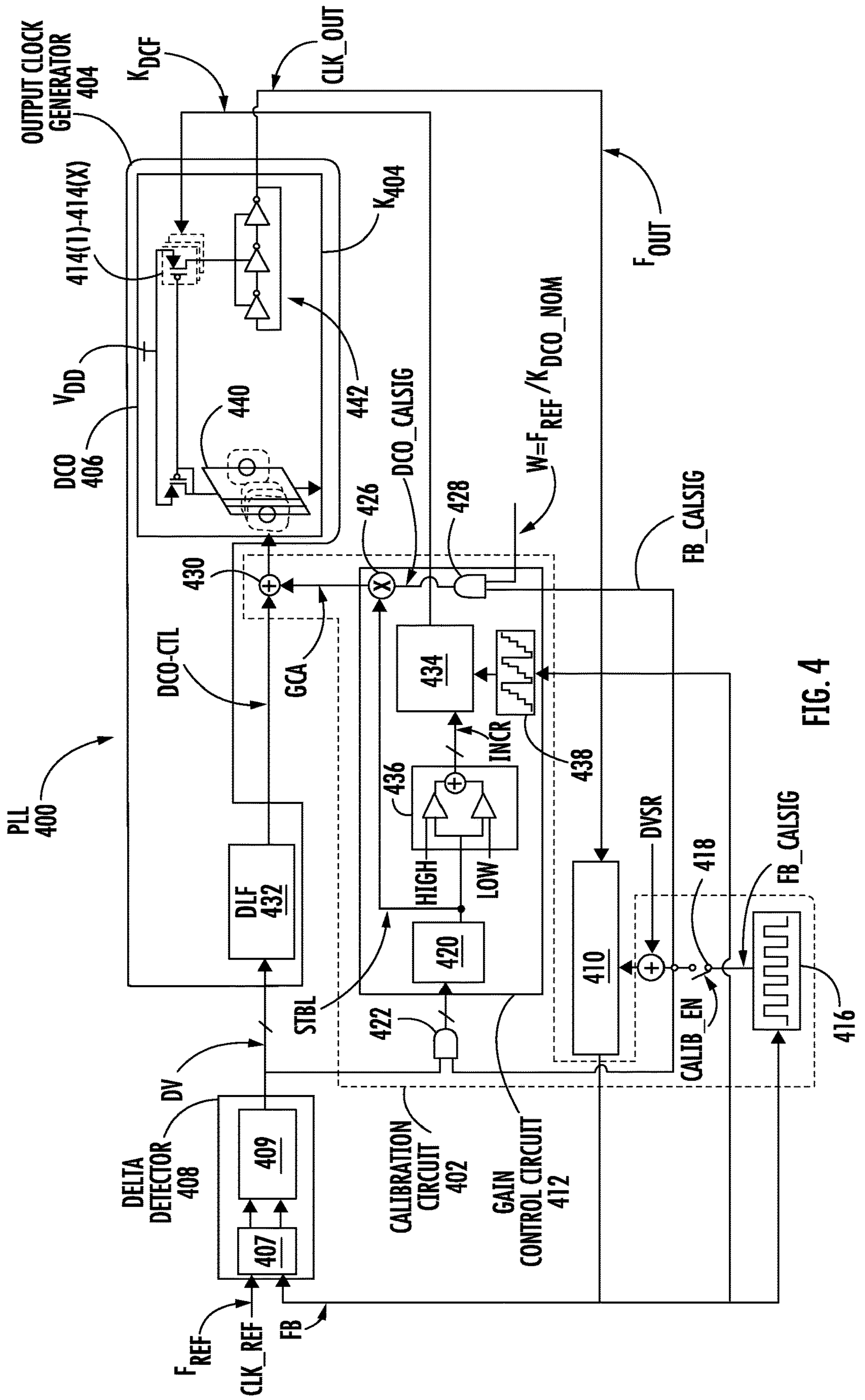
FIG. 4 is a second example of an exemplary PLL that includes a calibration circuit configured to provide a gain correction factor to adjust an output clock generator to a nominal gain corresponding to a desired PLL loop bandwidth.
Figure 6:
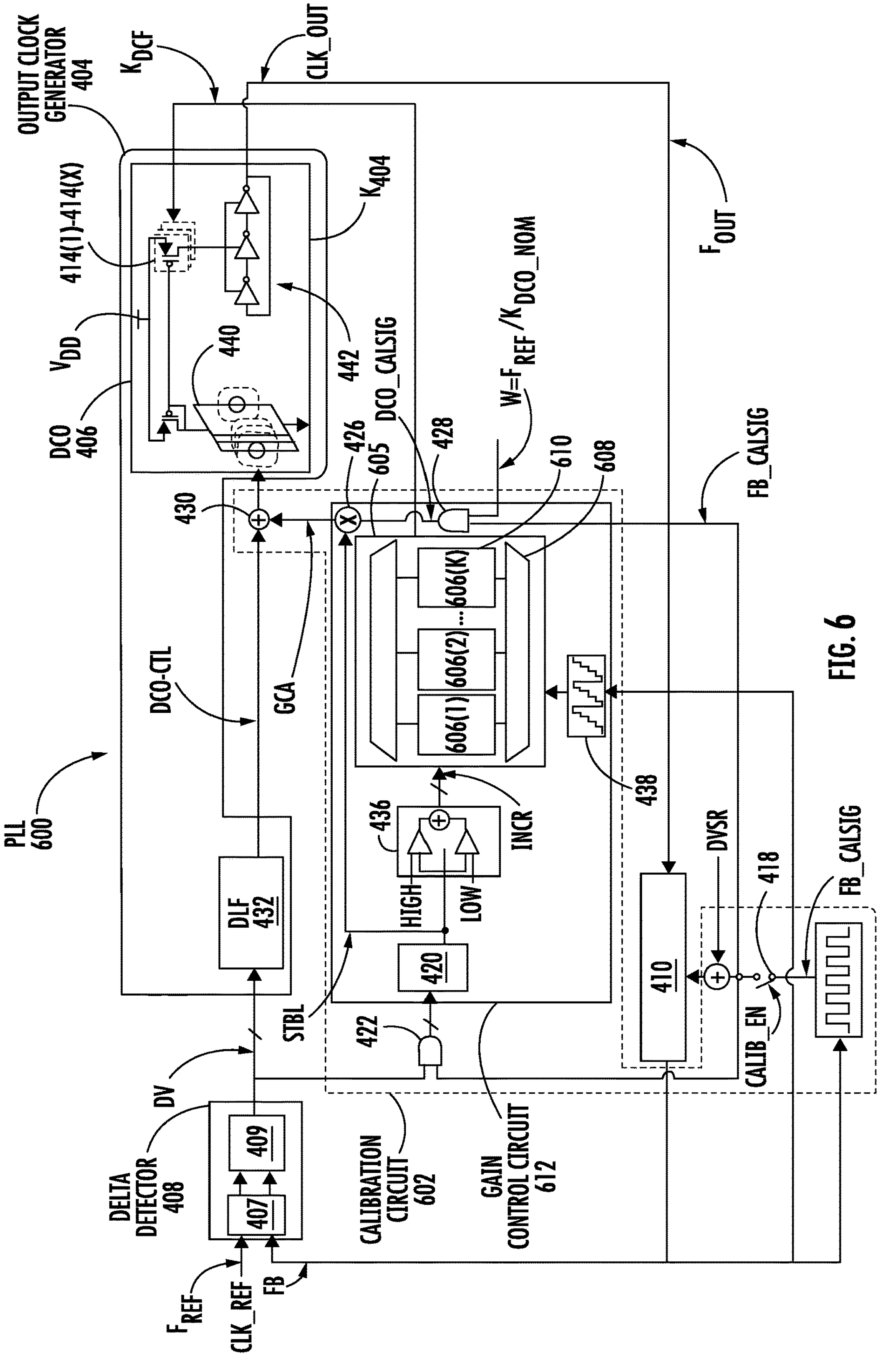
Figure 7:
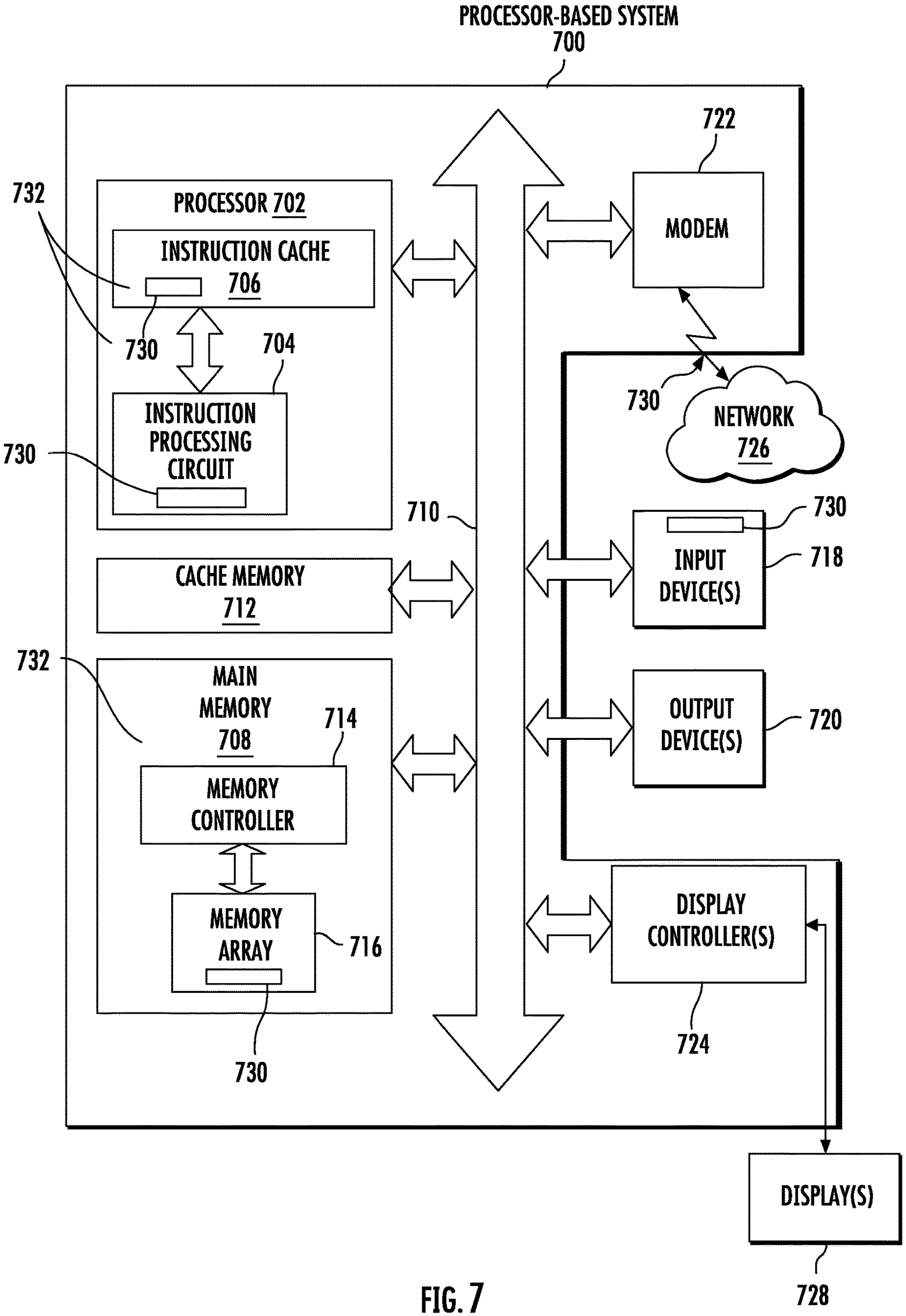

FIG. 6 is an example of the PLL in FIG. 4 configured to determine and store gain correction factors for a plurality of frequencies of the output clock generator in a PLL; and FIG. 7 is a block diagram of an exemplary processor-based system including a plurality of devices coupled together through a system bus, wherein the processor-based system comprises at least one integrated circuit (IC) that includes multiple clock domains, each with a PLL that includes a calibration circuit configured to provide a gain correction factor to adjust an output clock generator to a nominal gain, to normalize jitter response across the IC.

DETAILED DESCRIPTION

With reference to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Exemplary aspects disclosed herein include phase-locked loops (PLLs) that include digitally controlled oscillator (DCO) gain calibration circuits. Related methods of DCO gain calibration are also disclosed. Synchronization of the clocks in different clock domains of an integrated circuit (IC) is important in a high-performance interface between those clock domains. PLLs can achieve synchronization among the clock domains by generating domain clocks based on the same reference clock. However, jitter in the reference clock signal can upset the synchronization if the PLLs do not respond to the jitter in the same way. In an exemplary PLL disclosed herein, a calibration circuit provides a gain correction factor to achieve a nominal gain in an output clock generator for a desired loop bandwidth. In this manner, the PLLs in different clock domains can be calibrated to have a similar jitter response. If the loop bandwidths of all the PLLs in an IC are calibrated to the desired loop bandwidth, they will have similar responses to jitter in the reference clock and maintain a neglectable relative timing uncertainty as well as a high-performance interface. A PLL feedback loop detects a time difference between a reference clock and a feedback signal that is based on an output clock. The PLL includes an output clock generator that adjusts the output clock to reduce the time difference. The gain of the output clock generator, which is determined in part by the DCO, is one of the factors determining how the output clock generator responds to reference clock jitter. The DCO gain, and thus the output clock generator gain, can vary from one PLL to another due to differences in manufacturing processes and circuit environment. The calibration circuit may be employed to determine and provide a gain correction factor that adjusts the gain of the output clock generator to a nominal gain corresponding to a desired loop bandwidth in the PLL.

Figure 1A:
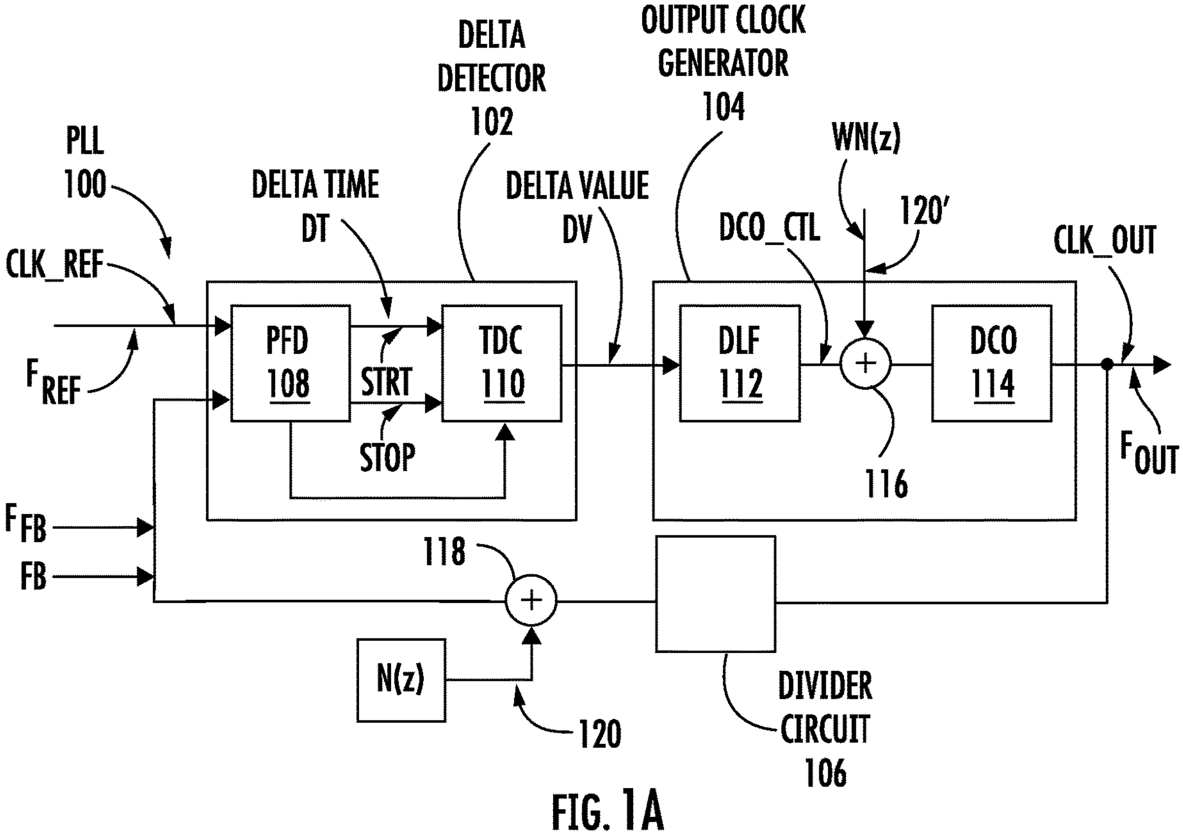
FIG. 1A is a block diagram of a phase-locked-loop (PLL) configured for two-point injection.

FIG. 1A is a block diagram of a phase-locked loop (PLL) 100 referred to in the following explanation of two-point injection employed in a calibration circuit 202 in a PLL 200 in FIG. 2.

The PLL 100 includes a delta detector 102, an output clock generator 104, and a divider circuit 106. The delta detector 102 receives a reference clock CLK_REF and a feedback signal FB from the divider circuit 106. The reference clock CLK_REF is received from an external source, such as a crystal-controlled oscillator, and oscillates at a reference frequency $F_{REF}$. The feedback signal FB oscillates at a frequency $F_{FB}$ that is the same as or very close to the reference frequency $F_{REF}$ of the reference clock CLK_REF. The delta detector 102 determines a delta time DT, which is a time difference between the reference clock CLK_REF and the feedback signal FB. The delta time DT is quantified digitally as a delta value DV (e.g., a binary number) generated by the delta detector 102.

The output clock generator 104 receives the delta value DV and generates an output clock CLK_OUT based on the delta value DV, which contains phase and frequency difference information between CLK_REF and CLK_OUT so that the output clock CLK_OUT can be generated at an output clock frequency $F_{OUT}$ that is a multiple (e.g., an integer multiple, N) of the reference frequency $F_{REF}$ The divider circuit 106 receives the output clock CLK_OUT at the output clock frequency $F_{OUT}$ and divides the output clock CLK_OUT (e.g., by the integer multiple N) to generate the feedback signal FB at the reference frequency $F_{REF}$.

In more detail, the delta detector 102 includes a phase-frequency detector (PFD) 108 and a time-to-digital converter (TDC) 110. The PFD 108 receives the reference clock CLK_REF and the feedback signal FB, detects the delta time DT, and indicates the delta time DT as a time difference between a start signal STRT and a stop signal STOP provided to the TDC 110. For example, the delta time DT may be the time between a rising edge (e.g., of voltage) of the start signal STRT and a rising edge of the stop signal STOP. The TDC 110 quantifies the delta time DT in digital form as a binary value that is provided as the delta value DV to the output clock generator 104. The delta value DV may be positive or negative depending on whether the feedback signal FB is leading or lagging the reference clock CLK_REF.

The output clock generator 104 includes a digital low-pass filter (DLF) 112 and a digitally-controlled oscillator (DCO) 114 that generate the output clock CLK_OUT. The DLF 112 receives the delta value DV from the TDC 110, filters out high-frequency noise, and provides a control signal DCO_CTL to the DCO 114. The DCO 114 adjusts the frequency of the output clock CLK_OUT based on the control signal DCO_CTL.

As noted, the PLL 100 is configured for two-point injection. In this regard, the output clock generator 104 also includes a first adder 116 between the DLF 112 and the DCO 114. A second adder 118 is coupled between the divider circuit 106 and the delta detector 102. The locations of the first adder 116 and the second adder 118 are chosen to provide an all-pass transfer function for an injected signal 120. The injection from the first adder 116 to the output clock CLK_OUT has only the DCO 114 in the feedforward path, resulting in a high-pass transfer function that boosts higher frequency input above a first "corner" frequency. From the second adder 118 to the output clock CLK_OUT, the PLL 100 has a low-pass transfer function that filters out high-frequency inputs above a second "corner" frequency. By adding the injected signal 120 to the feedback signal FB in the second adder 118 and also adding the injected signal 120' to the control signal DCO_CTL in the first adder 116, the combination of the high-pass and low-pass filtering of the loop produces an all-pass transfer function if the first corner frequency and the second corner frequency are aligned at a same frequency. The injected signal 120' is a weighted version of the injected signal 120, multiplied by a coefficient that is needed for injection at the first adder 116.

The injected signal 120 may be added to the output clock CLK_OUT. This may include, for example, adding a function N(z) (see FIG. 1B) at the second adder 118 and adding a weighted version of the function N(z) (W×N(z)) to the control signal DCO_CTL at the first adder 116. The coefficient W is used at the first adder 116 to account for differences in the injection points. In a transmitter, two-point injection can be used to modulate a carrier signal (e.g., CLK_OUT) by adding the injected signal 120 (N(z)) as a data signal to be transmitted. The injected signal 120 with function N(z) may be seen on the output clock CLK_OUT (e.g., by modulation) as $N(z)_{OUT}$ (see FIG. 1C). The relationship of the output signal $N(z)_{OUT}$ to the injected signal 120 depends on the matching between the weight factor W and the gain of DCO 114. When other components of PLL are well gain-controlled, we can also say the relationship depends on the matching between the nominal/target and real loop bandwidth of the PLL 100. In general, the loop bandwidth (LBW) of the PLL 100 is represented by the equation:

$$LBW=K_{DD}\times K_{DLF}\times K_{DCO}\times 1/2\pi N;$$ where:

$K_{DD}$=gain of the delta detector 102;

$K_{DLF}$=proportional component of gain of the DLF 112;

$K_{DCO}$=frequency gain of the DCO 114; and

N=clock divisor by which the output clock CLK_OUT is divided in the divider circuit 106 to generate the feedback signal FB. Some variables are not illustrated in FIG. 1.

Figure 1B:
FIGS. 1B and 1C are illustrations of a signal injected into the PLL in FIG. 1A and an output signal modulated on the output clock based on the injected signal, respectively.
Figure 1C:
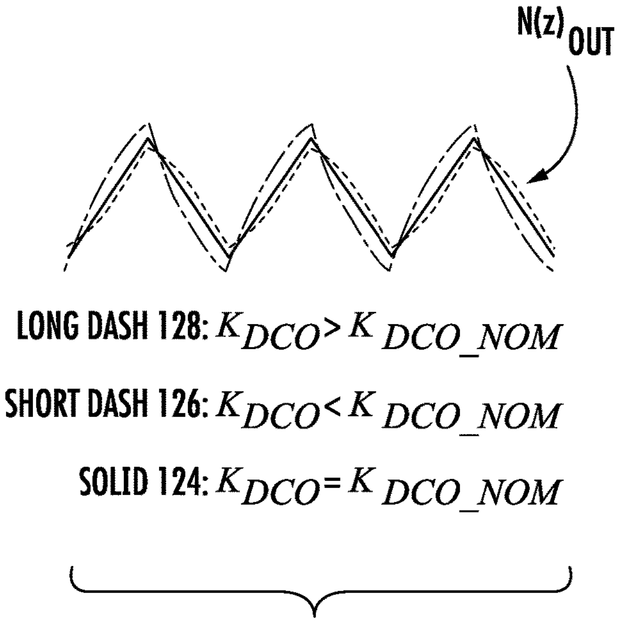

FIG. 1B is an example of the injected signal 120 (N(z)) added at the second adder 118 and, with a weight W applied to the injected signal 120 as 120' at the first adder 116. FIG. 1C shows examples of an output signal $N(z)_{OUT}$ that may be generated on the output clock CLK_OUT in response to the injected signal 120 (N(z)) under the conditions of three different loop bandwidths of the PLL 100, which may be due to three different gains ($K_{DCO}$) of the DCO 114. The solid line 124 in FIG. 1C illustrates the intended output signal $N(z)_{OUT}$, which best corresponds to the injected signal 120 (N(z)) in FIG. 1B. The short dash line 126 illustrates the output signal $N(z)_{OUT}$ produced on the output clock CLK_OUT in an example in which the loop bandwidth is not the desired loop bandwidth because the gain $K_{DCO}$ of the DCO 114 is lower than desired. Here, the DCO 114 has a weaker response to changes in the injected signal 120, rising and falling more slowly than expected. In contrast, the long dash line 128 illustrates the output signal $N(z)_{OUT}$ when the loop bandwidth is not the desired loop bandwidth because the gain $K_{DCO}$ is higher than desired, causing the DCO 114 to produce a stronger than desired response (i.e., rising and falling more than desired). However, the gain $K_{DCO}$ of the DCO 114 can change from one DCO to another based on factors including manufacturing process variations (process, voltage, temperature (PVT)) and circuit conditions in which the DCO is implemented. Thus, the gain of the DCO 114 in a PLL 100 may differ from one clock domain to another in an IC in response to such factors, leading to differences in loop bandwidth and causing the PLLs of different clock domains to respond differently to noise or jitter on the reference clock or other points in the PLL 100.

Figure 2:
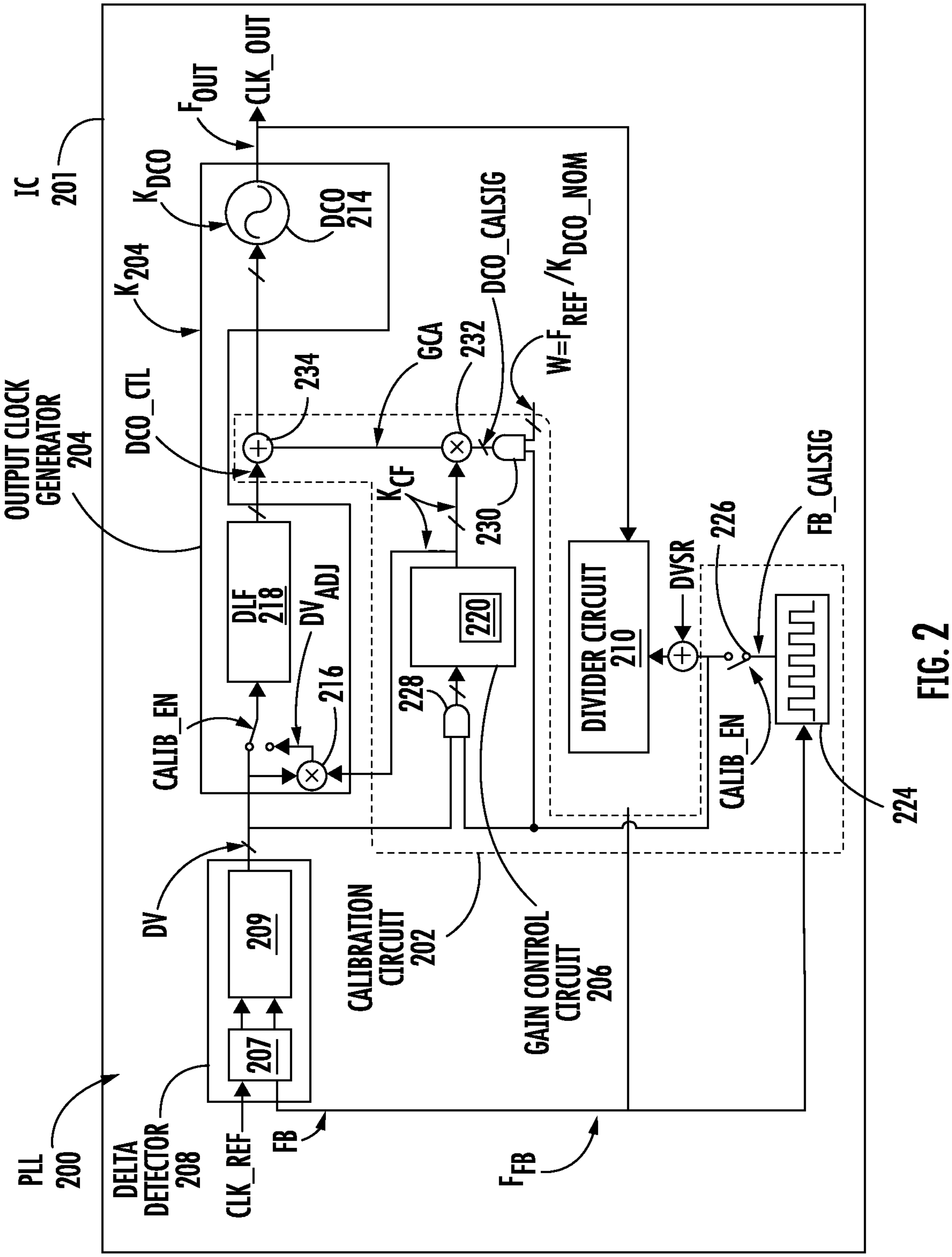
FIG. 2 is a first example of an exemplary PLL, including a calibration circuit configured to provide a gain correction factor to adjust an output clock generator to a nominal gain corresponding to a desired PLL loop bandwidth.

FIG. 2 is a block diagram of one example of an exemplary PLL 200 in an IC 201 that includes a calibration circuit 202 that provides a gain correction factor $K_{CF}$ to achieve a nominal gain $K_{NOM}$ (not shown) in an output clock generator 204 for a desired loop bandwidth in the PLL 200. The IC 201 may include a plurality of PLLs that could each be the exemplary PLL 200, each providing an output clock to a clock domain of digital logic circuits. The calibration circuit 202 is first employed in a calibration method to determine the gain correction factor $K_{CF}$ and store the gain correction factor $K_{CF}$ in a gain control circuit 206 in the calibration circuit 202. Following calibration, the output clock generator 204 receives the gain correction factor $K_{CF}$ from the gain control circuit 206 and adjusts the gain of the output clock generator 204 to the nominal gain $K_{NOM}$ to achieve a desired loop bandwidth.

Before describing the calibration circuit 202 and method of calibration, details of the PLL 200 are first presented. The PLL 200 corresponds to the PLL 100 in FIG. 1 configured for two-point injection. The PLL 200 includes a delta detector 208 that receives a reference clock CLK_REF and a feedback signal FB. The delta detector 208 generates a delta value DV, indicating a time difference between the reference clock CLK_REF and the feedback signal FB. The delta detector 208 includes a phase-frequency detector 207 and a time-to-digital converter 209. The PLL 200 also includes a divider circuit 210 that receives an output clock CLK_OUT generated by the output clock generator 204 and divides the output clock CLK_OUT to generate the feedback signal FB. A frequency $F_{OUT}$ of the output clock CLK_OUT can be tuned to a desired multiple (e.g., integer N) of a frequency $F_{REF}$ of the reference clock CLK_REF. The divider circuit 210 divides the output clock CLK_OUT by a clock divisor DVSR (e.g., N), such that a frequency $F_{FB}$ of the feedback signal is the same as, or very close to, the frequency $F_{REF}$ of the reference clock CLK_REF.

The output clock generator 204 receives the delta value DV from the delta detector 208 and generates a control signal DCO_CTL. A DCO 214 in the output clock generator 204 generates the output clock CLK_OUT based on the control signal DCO_CTL. The PLL 200 includes the calibration circuit 202, which includes the gain control circuit 206, which further includes a gain correction accumulator circuit 220 ("accumulator 220") to generate and store the gain correction factor $K_{CF}$. A gain $K_{204}$ of the output clock generator 204 is adjusted in response to the gain correction factor $K_{CF}$. In particular, if the gain $K_{DCO}$ of the DCO 214 is not a nominal gain $K_{DCO\_NOM}$ that provides the desired loop bandwidth of the PLL 200, the gain correction factor $K_{CF}$ can be determined and applied to adjust the (total) gain $K_{204}$ of the output clock generator 204.

In the PLL 200 in FIG. 2, the output clock generator 204 includes a digital multiplier circuit 216 coupled to the gain control circuit 206 and the delta detector 208. The digital multiplier circuit 216 receives the gain correction factor $K_{CF}$ and the delta value DV as multi-bit digital values and multiplies them together to generate an adjusted delta value $DV_{ADJ}$. Multiplying the delta value DV by the gain correction factor $K_{CF}$ adjusts the total gain $K_{204}$ of the output clock generator 204 to a desired nominal gain value at which the PLL 200 has a desired loop bandwidth for an all-pass transfer capability. The gain correction factor $K_{CF}$ can be applied to each PLL in an IC to provide a similar, if not identical, response to jitter in the reference clock CLK_REF. Consistent jitter response minimizes synchronization problems between clocks in different clock domains, thereby maintaining optimized interface conditions between the clock domains. Within the output clock generator 204, the adjusted delta value $DV_{ADJ}$ is provided to a digital low-pass filter (DLF) 218 that generates the control signal DCO_CTL based on the adjusted delta value $DV_{ADJ}$. An adder 234, discussed further below, does not modify the control signal DCO_CTL during normal operation.

In an alternative (not shown) to the example shown in FIG. 2, the output clock generator 204 would not include the digital multiplier circuit 216. Instead, the DLF 218 may receive the delta value DV directly from the delta detector 208 and generate a filtered delta value FDV (not shown) that would be provided to a multiplier at the location of the adder 234 in FIG. 2. This multiplier would receive the filtered delta value FDV and the gain correction factor $K_{CF}$ and multiply them together to generate the control signal DCO_CTL provided to the DCO 214. Essentially, the digital multiplier circuit 216 is simply moved from the input to the output of the DLF 218. This alternative example is possible because the gain correction factor $K_{CF}$ can be applied to either the delta value DV (in the example shown in FIG. 2) or to the filtered delta value FDV (in the alternative example).

Returning to the PLL 200 in FIG. 2, features of the calibration circuit 202 are described in the context of a method of calibrating the PLL 200, which includes determining the gain correction factor $K_{CF}$ needed for the PLL 200 to have the nominal gain $K_{NOM}$. The gain correction factor $K_{CF}$ is stored in the accumulator 220. The calibration relies on aspects of the two-point injection method. As described with reference to FIGS. 1A-1C, if a first corner frequency of the high-pass transfer function of the DCO 214 corresponds to a second corner frequency of the low-pass transfer function of the PLL 200, the loop bandwidth of the PLL 200 will provide an all-pass transfer function from N(z) to the output clock CLK_OUT. Alignment of the first corner frequency and the second corner frequency depends, in part, on the gain $K_{DCO}$ of the DCO 214 being at a nominal gain value $K_{DCO\_NOM}$ but the gain $K_{DCO}$ can vary due to a variety of manufacturing and environmental factors. Determining whether the gain $K_{DCO}$ is at the nominal gain value $K_{DCO\_NOM}$ can include monitoring the response of the PLL 200 to the two-point injection of a signal. In this regard, the corresponding calibration signals FB_CALSIG and DCO_CALSIG are injected into the feedback signal FB and the control signal DCO_CTL, respectively. DCO_CALSIG is a weighted version of FB_CALSIG with the weight factor $W=F_{REF}/K_{DCO\_NOM}$, i.e., $DCO\_CALSIG=F_{REF}/K_{DCO\_NOM}\times FB\_CALSIG$. FB_CALSIG is added into the divisor DVSR of divider circuit 210, giving a slow frequency change on $F_{OUT}$ by $F_{REF}\times FB\_CALSIG$. At the same time, a gain calibration adjustment GCA (equal to DCO_CALSIG when $K_{CF}=1$, i.e., when gain control circuit 206 is not started yet) is injected into DCO_CTL to immediately change $F_{OUT}$ by $F_{REF}/K_{DCO\_NOM}\times FB\_CALSIG\times K_{DCO}$. If $K_{DCO\_NOM}=K_{DCO}$, two injections contribute the exact same frequency change amount with an all-pass transfer. Otherwise, access gain of either low-pass or high-pass path will cause an output distortion as shown by FIG. 1C. Such a distortion will generate a time error (denoted by delta value DV) which is then collected by gain control circuit 206 to produce an error gradient for the gain corrector calculation in the way of least mean square (LMS). After some iterations, the final gain corrector $K_{CF}$ value will be very close to $K_{DCO\_NOM}/K_{DCO}$. The calibration resolution is determined by the bit length used in the accumulator 220.

In this example, the calibration input FB_CALSIG is a series of pulses (with only two levels "0" and "1"). Each of such pulses has the duration of multiple cycles (e.g., M cycles) of the reference clock CLK_REF. As explained in more detail below, a pulse of the calibration signal FB_CALSIG causes the divider circuit 210 to increment the clock divisor DVSR (e.g., from N to N+1). The delta value DV is monitored/collected during a positive pulse of the calibration signal FB_CALSIG (realized by an AND logic circuit ("gate") 228). The accumulator 220 initializes the gain correction factor $K_{CF}$ to value "1". In each cycle of FB_CALSIG, the accumulator 220 incrementally increases or decreases the gain correction factor $K_{CF}$ based on the error gradient, i.e., the output of gate 228 until $K_{CF}$ is fairly close to the target $K_{DCO\_NOM}/K_{DCO}$ with the preset resolution.

Also occurring in each cycle of the reference clock CLK_REF during a pulse of the calibration signal FB_CALSIG, the gain correction factor $K_{CF}$ is multiplied by the nominal calibration value DCO_CALSIG to generate a gain calibration adjustment GCA, which is the product of the multiplication. The gain calibration adjustment GCA is injected (i.e., added) into the control signal DCO_CTL. The nominal calibration value DCO_CALSIG corresponds to the weighted version of the injected signal 120 in FIG. 1, discussed above, and the weight coefficient is based on the frequency $F_{REF}$ of the reference clock CLK_REF and the nominal gain $K_{DCO\_NOM}$ of the DCO 214, which further corresponds to a nominal gain $K_{NOM}$ of the output clock generator 204 for a desired loop bandwidth of the PLL 200. The gain correction factor $K_{CF}$ stabilizes (i.e., stops or nearly stops incrementing) when the gain correction factor $K_{CF}$ causes the output clock generator 204 to achieve the nominal gain $K_{NOM}$.

The control signal DCO_CTL may be increased or decreased by the gain calibration adjustment GCA depending on the sign of the gain correction factor $K_{CF}$. In this manner, the change to the gain correction factor $K_{CF}$ in one cycle of the reference clock CLK_REF causes an adjustment to the control signal DCO_CTL, which causes a change to the output clock CLK_OUT, and the delta value DV reflects the adjustment in the next cycle. After a number of cycles of the reference clock CLK_REF (during a pulse of the calibration signal FB_CALSIG), the effect of the changing gain correction factor $K_{CF}$ causes the delta value DV to decrease, so the accumulator 220 stops adjusting the gain correction factor $K_{CF}$.

A pulse of the calibration signal FB_CALSIG may be indicated by an increase in voltage for a period of time (e.g., from 0 volts to a supply voltage $V_{DD}$). Between pulses of the calibration signal FB_CALSIG (e.g., while at 0 volts), the clock divisor DVSR returns from N+1 back to N, the accumulator 220 does not modify the gain correction factor $K_{CF}$ in the accumulator circuit 220, and the gain calibration adjustment GCA does not modify the control signal DCO_CTL. After the previously described operations are repeated for a number of pulses of the calibration signal FB_CALSIG, the gain correction factor $K_{CF}$ remains stable, and the desired loop bandwidth has been achieved. At the completion of the calibration method, the gain correction factor $K_{CF}$ is provided to the output clock generator 204 during normal operation (e.g., henceforth), as described above, for the operation of the PLL 200 at the desired loop bandwidth.

As noted above, the accumulator circuit 220 is included in the gain control circuit 206 in the calibration circuit 202. Additional features of the calibration circuit 202 shown in FIG. 2 include the following. The calibration signal FB_CALSIG is generated by a signal divider 224 that receives the feedback signal FB and generates the calibration signal FB_CALSIG based on the feedback signal FB. During a pulse, the calibration signal FB_CALSIG is at an active state, which may be at a power supply voltage $V_{DD}$. Between pulses, the calibration signal FB_CALSIG may be at a low voltage (e.g., ground, $V_{SS}$ and/or 0 volts). A switch 226 couples the signal divider 224 to the divider circuit 210 while calibration is enabled by a calibration enable signal CALIB_EN. The feedback signal FB may be divided by an integer value 2M to produce the calibration signal FB_CALSIG, in which each pulse has a duration of M cycles of the feedback signal FB. An AND gate 228 passes the delta value DV to the accumulator 220 in response to the calibration signal FB_CALSIG being active (e.g., during a pulse of the calibration signal FB_CALSIG). Another AND gate 230 determines whether the nominal calibration value DCO_CALSIG is multiplied by the gain correction factor $K_{CF}$, which causes the gain calibration adjustment GCA to be injected into the control signal DCO_CTL. A multiplier circuit 232 multiplies the nominal calibration value DCO_CALSIG and the gain correction factor $K_{CF}$. The gain calibration adjustment GCA, which is the product of the nominal calibration value DCO_CALSIG and the gain correction factor $K_{CF}$, is added to the control signal DCO_CTL by an adder 234. The specific details of the calibration circuit 202 and the method of calibration described above are a non-limiting example.

FIG. 3 is a flowchart illustrating the method 300 of adjusting the gain of the PLL 200. The method includes receiving, in a delta detector 208, a reference clock CLK_REF and a feedback signal FB (block 302) and generating a delta value DV indicating a time difference between the reference clock CLK_REF and the feedback signal FB (block 304). The method includes receiving, in a divider circuit 210, an output clock CLK_OUT (block 306) and dividing the output clock CLK_OUT to generate the feedback signal FB (block 308). The method includes receiving, in an output clock generator 204, the delta value DV (block 310), generating a control signal DCO_CTL based on the delta value DV (block 312), and generating the output clock CLK_OUT based on the control signal DCO_CTL (block 314). The method further includes storing a gain correction factor $K_{CF}$ in a gain control circuit 206 in a calibration circuit 202 (block 316), providing the gain correction factor $K_{CF}$ to the output clock generator 204 (block 318), and adjusting, in the output clock generator 204, a gain in response to the gain correction factor $K_{CF}$ (block 320).

FIG. 4 is a block diagram of a second example of an exemplary PLL 400, including a calibration circuit 402 that provides a gain correction factor $K_{DCF}$ to an output clock generator 404 to achieve a nominal gain $K_{NOM}$ for a desired loop bandwidth. Features of FIG. 4 having similar functions to features of FIG. 2 may be named alike. As a reminder, in the PLL 200 above, adjusting a gain of the output clock generator 204 includes multiplying the delta value DV by the gain correction factor $K_{CF}$ to generate an adjusted delta value $DV_{ADJ}$ in the output clock generator 204. The adjusted delta value $DV_{ADJ}$ and the gain $K_{DCO}$ of the DCO 214 provide the nominal (e.g., desired) gain $K_{NOM}$ in the output clock generator 204. In contrast, as described below, adjusting a gain of the output clock generator 404 in the PLL 400 includes adjusting an amount of bias current to a ring oscillator 442 in a DCO 406 based on a gain correction factor $K_{DCF}$ to achieve a nominal gain $K_{DCO\_NOM}$ in the DCO 406, which corresponds to the nominal gain $K_{NOM}$ in the output clock generator 404.

The PLL 400 includes a delta detector 408 and a divider circuit 410 that correspond to the delta detector 208 and the divider circuit 210 in FIG. 2, described above in detail. The delta detector 408 includes a phase-frequency detector 407 and a TDC circuit 409. The calibration circuit 402 includes features of the calibration circuit 202 in FIG. 2, but the gain correction factor $K_{DCF}$ in FIG. 4 adjusts the gain in the output clock generator 404 in a different manner than the gain correction factor $K_{CF}$ adjusts gain of the output clock generator 204 in FIG. 2. In addition, the output clock generator 404 does not include a digital multiplier corresponding to the digital multiplier circuit 216 in FIG. 2. Instead, the gain control circuit 412 controls bias current slices 414(1)-414(X) in the DCO 406 to directly adjust the frequency response of the DCO 406 to the control signal DCO_CTL. The bias current slices 414(1)-414(X) are each coupled to a power rail that provides a power supply voltage $V_{DD}$. Adjusting the gain of the output clock generator 404 includes determining, based on the gain correction factor $K_{DCF}$, a number of the bias current slices 414(1)-414(X) activated to provide power to the DCO 406 to achieve the gain $K_{NOM}$ of the output clock generator 404.

Regarding structural details, the calibration circuit 402 includes a signal divider 416 that generates a calibration signal FB_CALSIG based on the feedback signal FB in the manner described with reference to FIG. 2. The calibration circuit 402 also includes a switch 418 to couple the signal divider 416 to the divider circuit 410 in response to the calibration enable signal CALIB_EN. During a pulse of the calibration signal FB_CALSIG, the divider circuit 410 increments the clock divisor DVSR (e.g., from N to N+1), causing the feedback signal FB to diverge from the reference clock CLK_REF and providing a first point of injection in the two-point injection method.

An AND gate 422 provides the delta value DV to an accumulator circuit ("accumulator") 420 in the gain control circuit 412. The accumulator 420 may implement an LMS algorithm to determine a stable gain indicator STBL over a plurality of cycles of the reference clock CLK_REF that occur during a pulse of the calibration signal FB_CALSIG, as described above. The gain control circuit 412 includes a multiplier circuit 426 and another AND logic circuit 428. In response to the calibration signal FB_CALSIG (in the active state), the AND gate 428 assigns DCO_CALSIG a weight factor $F_{REF}/K_{DCO\_NOM}$ to the multiplier circuit 426. The multiplier circuit 426 multiplies the nominal calibration value DCO_CALSIG with the stable gain indicator STBL to produce a gain calibration adjustment GCA. An adder circuit 430 coupled between a DLF 432 and the DCO 406 provides a second injection point into the PLL 400, as described above, where the gain calibration adjustment GCA is added to the control signal DCO_CTL. The calibration signal DCO_CALSIG is based on the frequency $F_{REF}$ of the reference clock CLK_REF and a nominal gain $K_{DCO\_NOM}$ of the DCO 406 (which in part determines the nominal gain $K_{NOM}$ of output clock generator 404). The stable gain indicator STBL stabilizes when the output clock generator 404 achieves the nominal gain $K_{NOM}$, which corresponds to the DCO 406 achieving the nominal gain $K_{DCO\_NOM}$ in response to the gain correction factor $K_{DCF}$.

The gain correction factor $K_{DCF}$ is generated based on the stable gain indicator STBL and stored in a second accumulator circuit 434 in the gain control circuit 412. Specifically, the gain control circuit 412 includes a clamping circuit 436 that receives the stable gain indicator STBL and generates an incremental adjustment INCR that is provided to the second accumulator circuit 434. The clamping circuit 436 also receives HIGH and LOW values of a desired range in which the stable gain indicator STBL is to stabilize. In response to the stable gain indicator STBL being above the HIGH value or below the LOW value, the clamping circuit 436 causes the incremental adjustment INCR to indicate whether the second accumulator circuit 434 should be increased, decreased, or remain unchanged (e.g., with values of +1, −1, 0) to achieve and stay between the HIGH and LOW values.

As noted above, the gain correction factor $K_{DCF}$ controls the number of bias current slices 414(1)-414(X). The second accumulator circuit 434, generates the gain correction factor $K_{DCF}$ as a digital signal that determines how many of the current units are activated. When calibration of the output clock generator 404 is initiated, the gain correction factor $K_{DCF}$ may be set to activate, for example, half (X/2) of the bias current slices 414(1)-414(X). In response to the incremental adjustment INCR, the second accumulator circuit 434 gradually increases or decreases the gain correction factor $K_{DCF}$ based on the stable gain indicator STBL, which is based on the delta value DV. The change of current flowing into the DCO 406 correspondingly increases or decreases the frequency gain of the output clock CLK_OUT. After a plurality of cycles of the reference clock CLK_REF with the calibration signal FB_CALSIG in the active state (i.e., during a pulse), the gain correction factor $K_{DCF}$ stored in the second accumulator circuit 434 increases or decreases the number of active bias current slices 414(1)-414(X), the output clock CLK_OUT adjusts, the delta value DV is reduced, and the stable gain indicator STBL stabilizes at a value in the desired range between the HIGH and LOW values provided to the clamping circuit 436.

Depending on the number X of bias current slices 414(1)-414(X), the gain correction factor $K_{DCF}$ may be a low granularity value (e.g., a binary word with a large number of fractional bits). The gain correction factor $K_{DCF}$ is adjusted gradually because each incremental change may significantly alter the amount of current to the DCO 406. Gradual adjustment gives the PLL 400 enough time to respond to each change to the gain correction factor $K_{DCF}$. In this regard, the gain control circuit 412 further includes a counter circuit 438 ("counter 438") that is incremented with each pulse of the feedback signal FB until a counter value reaches a maximum number, which indicates the expiration of a calibration period. After reaching the maximum number, counter 438 resets and starts counting again. The second accumulator circuit 434 is clocked each calibration period when the most-significant bit (MSB) of the counter value of the counter 438 transitions (e.g., from 1 to 0). In this manner, the second accumulator circuit 434 only adjusts the gain correction factor $K_{DCF}$ once each period between transitions of the MSB of the counter 438 to ensure gradual adjustment to the gain correction factor $K_{DCF}$.

Regarding the DCO 406, the example in FIG. 4 includes a current matching circuit 440, controlled by the control signal DCO_CTL, and a ring oscillator 442 that is tuned by bias current slices 414(1)-414(X). The bias current slices 414(1)-414(X) are coupled in parallel to a power rail (not shown), providing a power supply voltage (e.g., $V_{DD}$). The number of the bias current slices 414(1)-414(X) that are activated to provide power to the DCO 406 is based on the gain correction factor $K_{DCF}$. Operation of such features should be understood by persons skilled in the relevant art.

Figure 5:
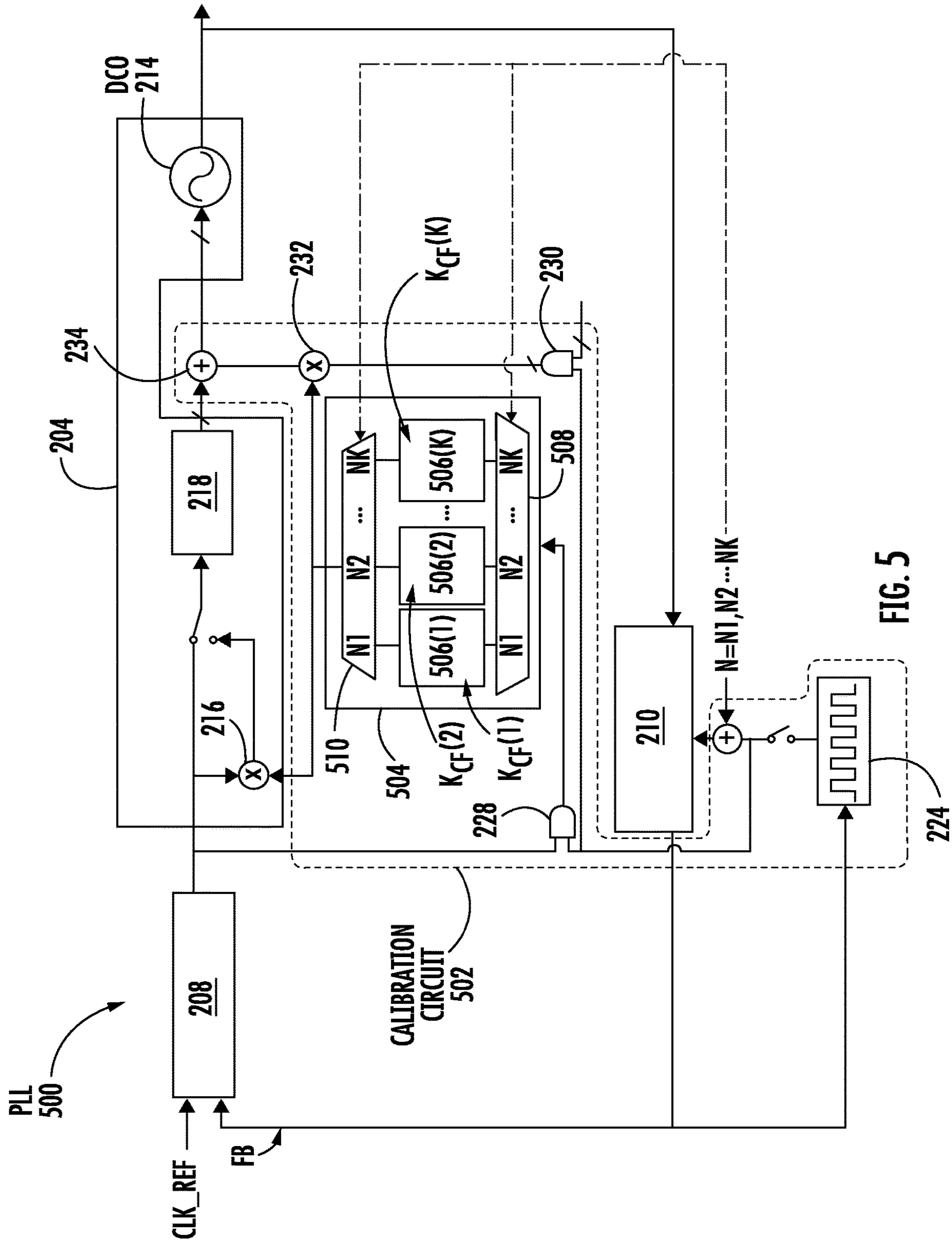
FIG. 5 is an example of the PLL in FIG. 2 configured to determine and store gain correction factors for a plurality of frequencies of the output clock generator in a PLL.

FIGS. 5 and 6 illustrate variations of the PLL 200 in FIG. 2 and the PLL 400 in FIG. 4 modified to be configurable to nominal gains $K_{NOM}$ at multiple frequencies of operation.

The features of the PLL 500 in FIG. 5 that correspond to FIG. 2 are numbered alike and not explained again here. The calibration circuit 502 includes a gain control circuit 504 corresponding to the gain control circuit 206, including the AND gate 228 and 230, the multiplier circuit 232, and the adder 234. Instead of the accumulator 220, the gain control circuit 504 includes the accumulators 506(1)-506(K), where K is a number of frequencies at which the PLL 500 can be calibrated. The multiplexors 508 and 510 are controlled by control logic (not shown), which may be internal or external to the PLL 500. Each of the plurality of output clock frequencies at which the PLL 500 is calibrated corresponds to an integer N1-NK employed as the divisor DVSR. The multiplexor 508 is used to select one of the plurality of accumulators 506(1)-506(K) at a time for storing gain correction factors $K_{CF}$(1)-$K_{CF}$(K) determined during calibration at one of K different frequencies. The multiplexor 510 is controlled to select one of the gain correction factors, $K_{CF}$(1)-$K_{CF}$(K), corresponding to a PLL operating frequency. At each of the calibration frequencies, corresponding to integers N1-NK, operation of the calibration circuit 502 corresponds to the operation of the calibration circuit 202 in FIG. 2.

The PLL 600 in FIG. 6 essentially corresponds to the PLL 400 in FIG. 4, so like features are numbered alike and not explained again here. The PLL 600 differs from the PLL 400 with regard to the calibration circuit 602, including a gain control circuit 604, because the PLL 600 can also be calibrated at a plurality of frequencies corresponding to different integer clock divisors DVSR. The gain control circuit 604 corresponds to the gain control circuit 412 at each of a plurality of frequencies, but like the PLL 500, the PLL 600 can be calibrated to a number (K) of frequencies. In this regard, the second accumulator circuit 434 of FIG. 4 has been replaced by a second accumulator circuit 605 and multiplexors 608 and 610 corresponding to the accumulators 506(1)-506(K) and multiplexors 508 and 510 in FIG. 5. The multiplexors 608 and 610 are used to select one of the accumulator circuits 606(1)-606(K) for generating and storing a gain correction factor $K_{DCF}$ corresponding to a selected output clock frequency $F_{OUT}$, at each integer clock divisor DVSR (N) provided to the divider circuit 410. At each individual calibration frequency, operation of the calibration circuit 602 corresponds to the operation of the calibration circuit 402 in FIG. 4.

FIG. 7 is a block diagram of an exemplary processor-based system 700 that includes a processor 702 (e.g., a microprocessor) that includes an instruction processing circuit 704. The processor-based system 700 may be a circuit or circuits included in an electronic board card, such as a printed circuit board (PCB), a server, a personal computer, a desktop computer, a laptop computer, a personal digital assistant (PDA), a computing pad, a mobile device, or any other device, and may represent, for example, a server, or a user's computer. In this example, the processor-based system 700 includes the processor 702. The processor 702 represents one or more general-purpose processing circuits, such as a microprocessor, central processing unit, or the like. More particularly, the processor 702 may be an EDGE instruction set microprocessor or other processor implementing an instruction set that supports explicit consumer naming for communicating produced values resulting from execution of producer instructions. The processor 702 is configured to execute processing logic in instructions for performing the operations and steps discussed herein. In this example, the processor 702 includes an instruction cache 706 for temporary, fast access memory storage of instructions accessible by the instruction processing circuit 704. Fetched or prefetched instructions from a memory, such as a main memory 708, over a system bus 710, are stored in the instruction cache 706. Data may be stored in a cache memory 712 coupled to the system bus 710 for low-latency access by the processor 702. The instruction processing circuit 704 is configured to process instructions fetched into the instruction cache 706 and process the instructions for execution.

The processor 702 and the main memory 708 are coupled to the system bus 710 and can intercouple peripheral devices included in the processor-based system 700. As is well known, the processor 702 communicates with these other devices by exchanging address, control, and data information over the system bus 710. For example, the processor 702 can communicate bus transaction requests to a memory controller 714 in the main memory 708 as an example of a slave device. Although not illustrated in FIG. 7, multiple system buses 710 could be provided; wherein each system bus 710 constitutes a different fabric. In this example, the memory controller 714 is configured to provide memory access requests to a memory array 716 in the main memory 708. The memory array 716 is comprised of an array of storage bit cells for storing data. The main memory 708 may be a read-only memory (ROM), flash memory, dynamic random-access memory (DRAM), such as synchronous DRAM (SDRAM), etc. and/or static memory (e.g., flash memory, SRAM, etc.), as non-limiting examples.

Other devices can be connected to the system bus 710. As illustrated in FIG. 7, these devices can include the main memory 708, one or more input device(s) 718, one or more output device(s) 720, a modem 722, and one or more display controllers 724, as examples. The input device(s) 718 can include any type of input device, including but not limited to input keys, switches, voice processors, etc. The output device(s) 720 can include any type of output device, including but not limited to audio, video, other visual indicators, etc. The modem 722 can be any device configured to allow exchange of data to and from a network 726. The network 726 can be any type of network, including but not limited to a wired or wireless network, a private or public network, a local area network (LAN), a wireless local area network (WLAN), a wide area network (WAN), a BLUETOOTH™ network, and the Internet. The modem 722 can be configured to support any type of communications protocol desired. The processor 702 may also be configured to access the display controller(s) 724 over the system bus 710 to control information sent to one or more displays 728. The display(s) 728 can include any type of display, including but not limited to a cathode ray tube (CRT), a liquid crystal display (LCD), a plasma display, etc.

The processor-based system 700 in FIG. 7 may include a set of instructions 730 to be executed by the processor 702 for any application desired according to the instructions. The instructions 730 may be stored in the main memory 708, processor 702, and/or instruction cache 706 as examples of a non-transitory computer-readable medium 732. The instructions 730 may also reside, completely or at least partially, within the main memory 708 and/or within the processor 702 during their execution. The instructions 730 may further be transmitted or received over the network 726 via the modem 722, such that the network 726 includes computer-readable medium 732.

Any of the circuits in the processor-based system 700, and in particular the modem 722 and the output devices 720, may include multiple clock domains, each including a PLL that includes a calibration circuit configured to provide a gain correction factor to adjust an output clock generator to a nominal gain, to normalize jitter response across the IC, as illustrated in FIGS. 2, 4, 5, and 6.

While the computer-readable medium 1132 is shown in an exemplary embodiment to be a single medium, the term "computer-readable medium" should be taken to include a single medium or multiple media (e.g., a centralized or distributed database and/or associated caches and servers) that store the one or more sets of instructions. The term "computer-readable medium" shall also be taken to include any medium that is capable of storing, encoding, or carrying a set of instructions for execution by the processing device and that causes the processing device to perform any one or more of the methodologies of the embodiments disclosed herein. The term "computer-readable medium" shall accordingly be taken to include, but not be limited to, solid-state memories, optical medium, and magnetic medium.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product or software that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes a machine-readable storage medium (e.g., ROM, random access memory ("RAM"), a magnetic disk storage medium, an optical storage medium, flash memory devices, etc.), and the like.

Unless specifically stated otherwise and as apparent from the previous discussion, it is appreciated that throughout the description, discussions utilizing terms such as "processing," "computing," "determining," "displaying," or the like refer to the action and processes of a computer system, or similar electronic computing device, that manipulates and transforms data and memories represented as physical (electronic) quantities within the computer system's registers into other data similarly represented as physical quantities within the computer system memories or registers or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from and write information to the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips that may be referenced throughout the above description may be represented by voltages, currents, electromagnetic waves, magnetic fields, optical fields, or particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations, and variations of the disclosed embodiments incorporating the spirit and substance of the invention may occur to persons skilled in the art, the invention should be construed to include everything within the scope of the appended claims and their equivalents.

What is claimed is:

1. A phase-locked loop, comprising:

a delta detector configured to:

receive a reference clock and a feedback signal; and generate a delta value indicating a time difference between the reference clock and the feedback signal;

a divider circuit configured to:

receive an output clock; and generate the feedback signal based on the output clock;

an output clock generator configured to:

receive the delta value;

generate a control signal based on the delta value; and generate the output clock based on the control signal; and a calibration circuit configured to inject a gain correction factor multiplied by a nominal calibration value into the control signal to the output clock generator, wherein the gain correction factor is incremented based on the delta value in each of a plurality of cycles of the reference clock until the gain correction factor causes the output clock generator to achieve a nominal gain corresponding to a desired loop bandwidth of the phase-locked loop.

2. The phase-locked loop of claim 1, the output clock generator further comprising:

a first multiplier circuit coupled to the calibration circuit and the delta detector and configured to multiply the delta value by the gain correction factor to generate an adjusted delta value; and a digital low-pass filter coupled to the first multiplier circuit and configured to generate the control signal based on the adjusted delta value.

3. The phase-locked loop of claim 1, the output clock generator further comprising:

a digital low-pass filter configured to generate a filtered delta value based on the delta value; and a first multiplier circuit configured to multiply the delta value by the gain correction factor to generate the control signal.

4. The phase-locked loop of claim 1, the output clock generator comprising a digitally controlled oscillator (DCO) that comprises bias current slices coupled in parallel to a power rail, wherein a number of the bias current slices are activated to provide power to the DCO is based on the gain correction factor.

5. The phase-locked loop of claim 4, the DCO further comprising a ring oscillator circuit, wherein the number of the bias current slices provide the power to the ring oscillator circuit.

6. The phase-locked loop of claim 1, the calibration circuit further comprising:

a calibration multiplier circuit; and an adder circuit, wherein:

the divider circuit is configured to:

divide the output clock by a clock divisor to generate the feedback signal; and in response to a calibration signal, increment the clock divisor; and the calibration circuit is further configured to, in response to the calibration signal:

multiply, in the calibration multiplier circuit, the gain correction factor by the nominal calibration value to generate an injected calibration adjustment;

add, in the adder circuit, the injected calibration adjustment to the control signal; and in each cycle of the plurality of cycles of the reference clock, incrementally adjust the gain correction factor based on the delta value in each of the plurality of cycles.

7. The phase-locked loop of claim 6, the calibration circuit further comprises:

a signal divider configured to:

receive the feedback signal;

generate a calibration signal based on the feedback signal; and change the clock divisor provided to the divider circuit in response to the calibration signal;

a first logic circuit configured to provide the delta value to an accumulator circuit in response to the calibration signal; and a second logic circuit configured to provide the nominal calibration value to the calibration multiplier circuit in response to the calibration signal.

8. The phase-locked loop of claim 1, the calibration circuit further comprises:

an accumulator circuit configured to store the gain correction factor;

a calibration multiplier circuit; and an injection circuit, wherein:

the divider circuit is configured to:

divide the output clock by a clock divisor to generate the feedback signal; and in response to a calibration signal, increment the clock divisor; and the calibration circuit is configured to, in response to the calibration signal:

multiply, by the calibration multiplier circuit, the gain correction factor by the nominal calibration value to generate a gain calibration adjustment;

add, by the injection circuit, the gain calibration adjustment into the control signal; and in each cycle of a plurality of cycles of the reference clock, adjust the gain correction factor stored in the accumulator circuit based on the delta value.

9. The phase-locked loop of claim 8, the calibration circuit further comprises:

a clamping circuit; and a counter circuit, wherein:

the clamping circuit is configured to:

determine whether the gain correction factor is within a desired range; and generate a gain adjustment in response to the determining;

the counter circuit is configured to count a number of cycles of the reference clock; and the calibration circuit is configured to adjust the gain correction factor based on the gain adjustment in each period.

10. The phase-locked loop of claim 8, the calibration circuit further comprises:

a signal divider configured to:

receive the feedback signal;

generate the calibration signal based on the feedback signal; and change the clock divisor provided to the divider circuit in response to the calibration signal;

a first logic circuit configured to provide the delta value to the accumulator circuit in response to the calibration signal; and a second logic circuit configured to provide the nominal calibration value to the calibration multiplier circuit in response to the calibration signal.

11. The phase-locked loop of claim 1, wherein the calibration circuit comprises a plurality of accumulators, each accumulator corresponding to one of a plurality of output clock frequencies.

12. A method of generating an output signal in a phase-locked loop, the method comprising:

receiving, in a delta detector, a reference clock and a feedback signal;

generating, in the delta detector, a delta value indicating a time difference between the reference clock and the feedback signal;

receiving, in a divider circuit, an output clock;

generating the feedback signal based on the output clock;

receiving, in an output clock generator, the delta value;

generating a control signal based on the delta value;

generating the output clock based on the control signal;

injecting, by a calibration circuit, a gain correction factor multiplied by a nominal calibration value into the control signal, and incrementing the gain correction factor based on the delta value in each of a plurality of cycles of the reference clock until the gain correction factor causes the output clock generator to achieve a nominal gain corresponding to a desired loop bandwidth of the phase-locked loop.

13. The method of claim 12, wherein adjusting a gain of the output clock generator in response to the gain correction factor further comprises:

multiplying the delta value by the gain correction factor to generate an adjusted delta value; and generating the control signal based on the adjusted delta value.

14. The method of claim 12, wherein adjusting a gain of the output clock generator in response to the gain correction factor further comprises:

generating a filtered delta value based on the delta value; and multiplying the delta value by the gain correction factor to generate the control signal.

15. The method of claim 12, further comprising controlling a number of bias current slices, among a plurality of bias current slices, activated based on the gain correction factor to provide power in parallel to a digitally controlled oscillator (DCO) in the output clock generator.

16. The method of claim 15, further comprising providing, by the number of bias current slices, power to a ring oscillator circuit in the output clock generator.

17. The method of claim 12, further comprising:
dividing the output clock by a clock divisor to generate the feedback signal;
incrementing the clock divisor in response to a calibration signal; and
in response to the calibration signal:
multiplying the gain correction factor by the nominal calibration value to generate an injected calibration adjustment;
adding the injected calibration adjustment to the control signal; and
in each cycle of a plurality of cycles of the reference clock, incrementally adjusting the gain correction factor based on the delta value.

18. The method of claim 12, further comprises:
changing a clock divisor in response to a calibration signal;
multiplying, by a calibration multiplier circuit, the gain correction factor by the nominal calibration value to generate an injected calibration adjustment;
adding the injected calibration adjustment into the control signal; and
in each cycle of the plurality of cycles of the reference clock, adjusting the gain correction factor based on the delta value.

19. The method of claim 18, further comprising:
determining whether the gain correction factor is within a desired range;
generating a gain adjustment in response to the determining;
incrementing, in each cycle of the reference clock, a counter value, wherein reaching a maximum number indicates expiration of a calibration period; and
controlling the calibration circuit to adjust the gain correction factor based on the gain adjustment in each calibration period.

20. The method of claim 18, further comprising:
receiving the feedback signal;
generating the calibration signal based on the feedback signal;
changing the clock divisor provided to the divider circuit in response to the calibration signal;
providing the delta value to the calibration circuit in response to the calibration signal; and
a second logic circuit configured to provide the nominal calibration value to the calibration multiplier circuit in response to the calibration signal.

21. The method of claim 12, further comprising:
determining a plurality of gain correction factors corresponding to each of a plurality of frequencies of the output clock; and
storing the plurality of gain correction factors in a plurality of accumulators in the calibration circuit.

22. An integrated circuit (IC), comprising:
logic circuits disposed in a plurality of clock domains, each clock domain comprising a plurality of phase-locked loops (PLLs) configured to generate clocks provided to the logic circuits in a corresponding clock domain, each PLL comprising:
a delta detector configured to:
receive a reference clock and a feedback signal; and
generate a delta value indicating a time difference between the reference clock and the feedback signal;
a divider circuit configured to:
receive an output clock; and
generate the feedback signal based on the output clock;
an output clock generator configured to:
receive the delta value;
generate a control signal based on the delta value; and
generate the output clock based on the control signal; and
a calibration circuit configured to inject a gain correction factor multiplied by a nominal calibration value into the control signal to the output clock generator,
wherein the gain correction factor is incremented based on the delta value in each of a plurality of cycles of the reference clock until the gain correction factor causes the output clock generator to achieve a nominal gain corresponding to a desired loop bandwidth of the PLL.

* * * * *